US008670588B2

(12) United States Patent
Rothkopf et al.

(10) Patent No.: US 8,670,588 B2
(45) Date of Patent: Mar. 11, 2014

(54) HANDHELD DEVICE ASSEMBLY

(75) Inventors: Fletcher Rothkopf, Mountain View, CA (US); Brian Lynch, Portola Valley, CA (US); Wey-Jiun Lin, Los Altos Hills, CA (US); Kyle Yeates, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 473 days.

(21) Appl. No.: 12/555,388

(22) Filed: Sep. 8, 2009

(65) Prior Publication Data

US 2011/0059348 A1 Mar. 10, 2011

(51) Int. Cl.
*H04R 1/02* (2006.01)
*H04R 25/00* (2006.01)
*H04R 1/20* (2006.01)

(52) U.S. Cl.
USPC ............................ 381/392; 381/189; 381/345

(58) Field of Classification Search
USPC .................. 381/162, 189, 345, 392; 361/600, 361/679.1, 746, 810, 812; 312/7.1; 455/350, 575.1; 181/199, 290; 367/188
See application file for complete search history.

(56) References Cited

U.S. PATENT DOCUMENTS

2003/0193283 A1* 10/2003 Aoki .............................. 313/269
2006/0171107 A1* 8/2006 Yamamoto et al. ........... 361/683

* cited by examiner

*Primary Examiner* — Duc Nguyen
*Assistant Examiner* — Matthew Eason
(74) *Attorney, Agent, or Firm* — Brownstein Hyatt Farber Shreck, LLP

(57) ABSTRACT

This is directed to several handheld device components to be placed in a handheld device, as well as methods or systems for mounting or retaining components within the device. In particular, this is directed to a rigid shield used in an SMT process and securing connected flex connectors by adhering the flexes together. This is also directed to using foam in combination with a hard material to create an acoustic seal, or several layers of foam to create an acoustic and mechanical seal. This is also directed to selectively folding a sheet of material placed around a battery cell.

11 Claims, 5 Drawing Sheets

HANDHELD DEVICE ASSEMBLY

BACKGROUND OF THE INVENTION

This is directed to particular components and the assembly of particular components in a handheld electronic device.

A portable electronic device can include a large number of components that must be placed within a housing. Although some of the components can be small, each component can have restrictions regarding the manner in which it must be positioned, or restrictions regarding the interaction of a component with other device components. These limitations or restrictions can require innovative solutions for placing and securing components within a handheld device housing, especially when the housing includes unique or unusual features or shapes.

SUMMARY OF THE INVENTION

This is directed to several handheld device components to be placed in a handheld device, as well as methods or systems for mounting or retaining components within the device.

Some device components can be coupled to a flex using SMT or other technologies. Because SMT requires a hard or rigid surface on which to operate, a rigid board may be placed behind the flex to ensure that the device components are properly mounted. When the device components must also be isolated from other components for electromagnetic interference reasons, a metal can or shield may be placed around the component. To reduce the total space required by the component and shield in the device, the rigid board can be selected from a metallic material to simultaneously provide a rigid board for SMT mounting as well as a shield from electromagnetic interference.

A handheld electronic device can include several connectors used to couple different device components. The connectors can each be coupled to separate circuit boards or flexes and positioned such that the connectors interact. The connectors, however, may disconnect during shock or drop events. To eliminate this issue, the flexes or circuit boards can be connected using an adhesive around the connectors to secure the connectors in a coupled position.

In some cases, the electronic device housing can include a component that needs an acoustic or mechanical seal. For example, a speaker coupled to a housing may need a mechanical seal to ensure proper functioning of the speaker. When the component is placed against a curved or arbitrarily shaped surface (e.g., a non-planar or non-circular surface), such as a curved surface of a rear housing of the device, it may be difficult to provide a seal using a single material. For example, a hard material that can be easily molded into an arbitrary shape can be sensitive to pressure or forces applied to the material (e.g., when other components press against the material), while softer materials that are less susceptible to failure when pressures or forces are applied may be difficulty shaped to match arbitrary or curved shapes. Instead, the device can use a combination of a hard material molded to match the arbitrary shape of the housing and a soft material operative to deflect and absorb applied forces to form a seal for the component.

Many batteries are constructed from a primary cell around which a thin sheet of material is wrapped. In many cases, the sheet of material is wrapped around the cell such that material is sealed around three sides of the cell. The excess material forming the seal can then be left flat or folded up, based on the space needs within the device. In some cases, however, other components in the device may be positioned such that the excess material cannot be left either flat or simply folded up. Instead, parts of the material may remain flat, while other parts may be folded up.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

Figure 1:
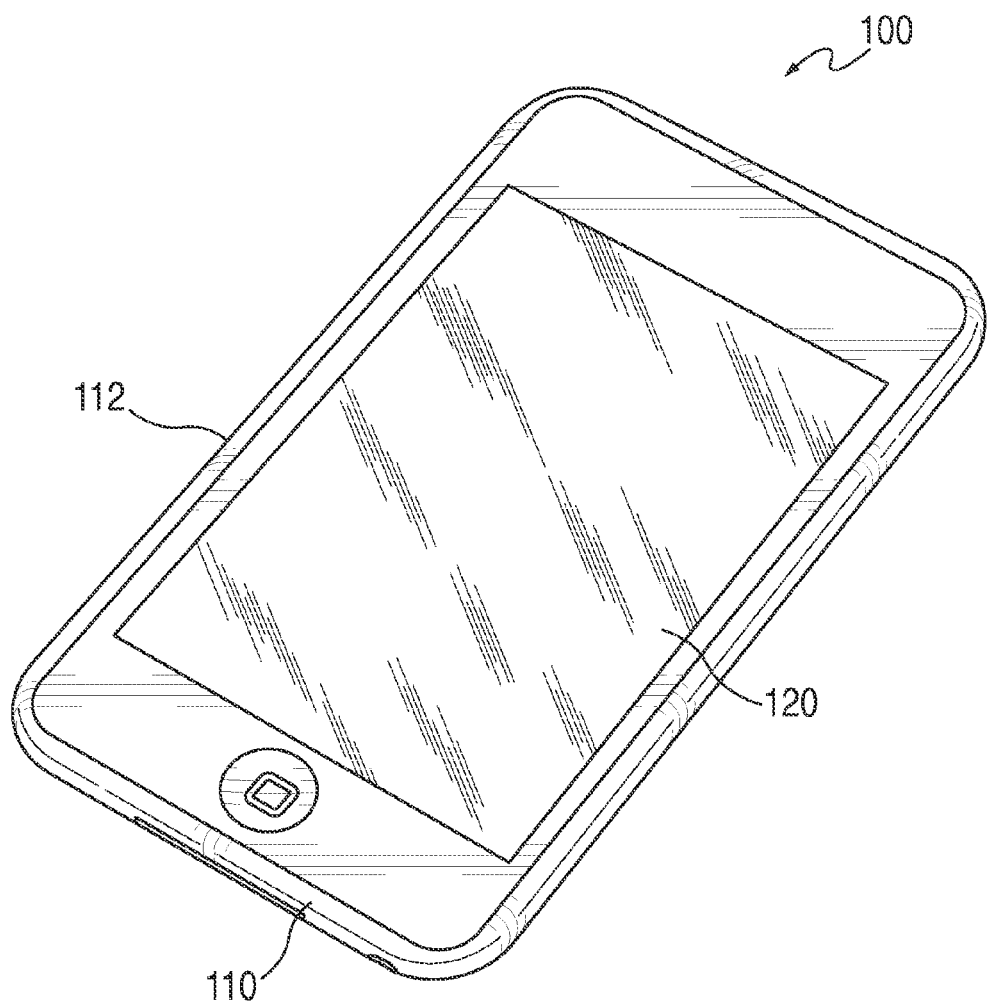
FIG. 1 is a schematic view of an illustrative electronic device in accordance with one embodiment of the invention.

FIG. 1 is a schematic view of an electronic device in accordance with one embodiment of the invention. Electronic device 100 can include housing 110, bezel 112, and window 120. Bezel 112 can be coupled to housing 110 in a manner to secure window 120 to the bezel. Housing 110 and bezel 112 can be constructed from any suitable material, including for example plastic, metal, or a composite material. Window 120 can be constructed from any suitable transparent or translucent material, including for example glass or plastic. Different electronic device components can be retained within electronic device 100 to provide different functionality to the user.

Figure 2:
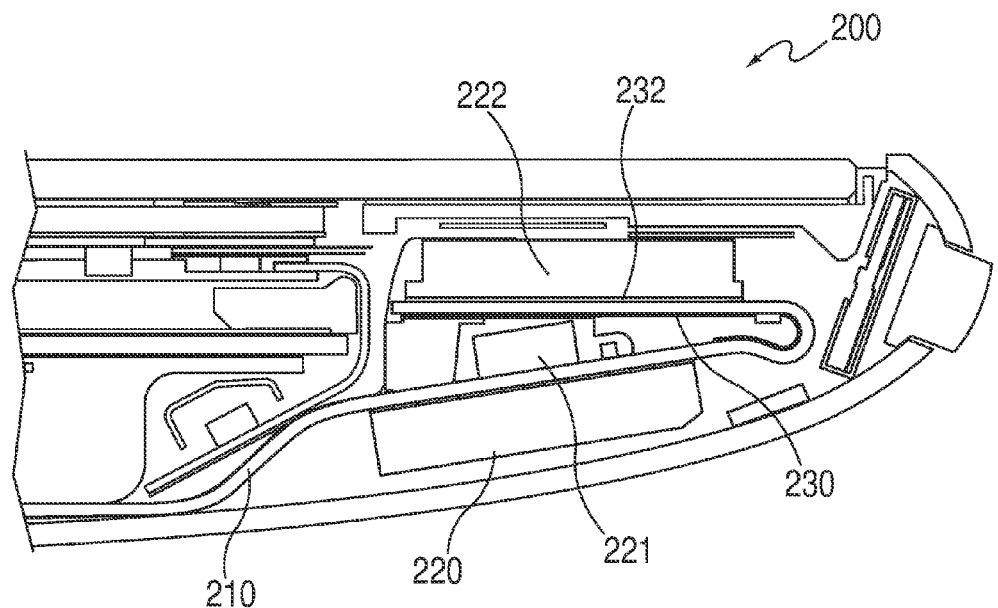
FIG. 2 is a cross-sectional view of an illustrative electronic device having components coupled to a flex in accordance with one embodiment of the invention.

Any type or number of components can be stored and retained within electronic device 100. In some embodiments, electronic device 100 can include components that are connected to a flex. FIG. 2 is a cross-sectional view of an illustrative electronic device having components coupled to a flex in accordance with one embodiment of the invention. Electronic device 200 can include several elements, including flex 210 on which components 220, 221 and 222 are mounted. Components 220, 221 and 222 can be mounted to flex 210 using any suitable approach, including for example via soldering or SMT. When SMT is used, a rigid plate may be placed behind flex 210 such that flex 210 is between the plate and the component to ensure that the SMT process provides an electrically conductive and mechanically sound coupling. The plate can be permanently or temporarily coupled to the flex. For example, plate 230 is positioned between flex 210 and component 222 such that coupling layer 232 (e.g., a layer of solder) electrically coupled component 222 to flex 210.

Plate 230 can be constructed from any suitable material. In some embodiments, the material used for plate 230 can be selected based on secondary criteria, for example related to the particular components coupled to flex 210. In one implementation, for example, component 220 can include a component that is generates noise or electromagnetic waves that can interfere with other components. For example, component 220 can include a communications module (e.g., a WiFi module) and component 221 can include a WiFi module inductor, both of which can generate electromagnetic radiation or other noise. Component 222 can include a component that is sensitive to noise, and that must therefore be shielded from components 220 and 221. Instead of adding a metallic cage or shield around component 222, or at least between component 222 and components 220 and 221, the electronic device can select the material used for plate 230 such that plate 230 can simultaneously serve as a plate for the SMT process as well as a shield for preventing noise generated by components 220 and 221 from reaching component 222. Plate 230 can be constructed from any suitable material, including for example a metal or other conductive material (e.g., austenitic steel).

Figure 3:
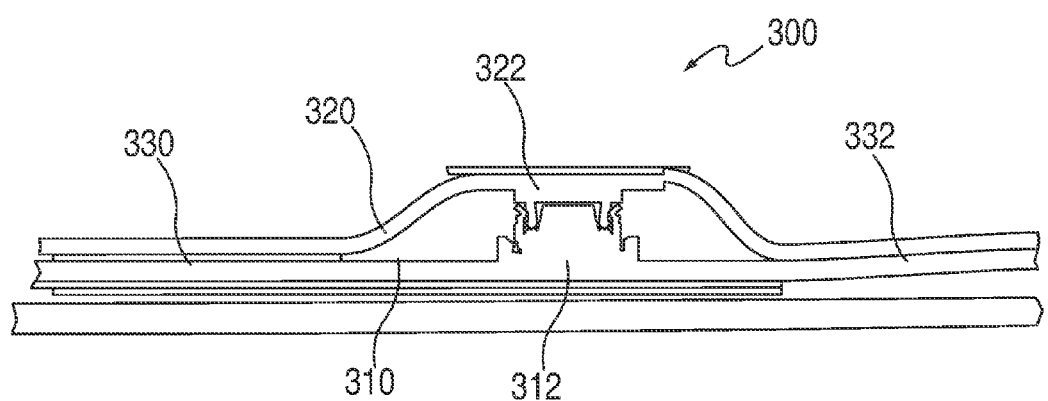
FIG. 3 is a cross-sectional view of connectors used in an electronic device in accordance with one embodiment of the invention.

In some cases, components of the electronic device can be coupled to each other via connectors associated with the device components. For example, connectors can be connected to one or more flexes and circuit boards (e.g., PCBs) and positioned such that opposing connectors can be coupled. If a connector is connected to a flex and engaged with a counterpart connector in an opposing flex or circuit board, the flex may not adequately retain the connector (e.g., keep the connector coupled to its counterpart) because the flex lacks rigidity. This can cause the connectors to disengage, for example during a shock or drop event. FIG. 3 is a cross-sectional view of connectors used in an electronic device in accordance with one embodiment of the invention. Electronic device 300 can include flex 310 (e.g., a primary or top flex of the device) and flex 320 (e.g., a secondary flex associated with a specific component, such as an antenna). To electrically couple flexes 310 and 320, each flex can include counterpart connectors 312 and 322, respectively. Connectors 312 and 322 can include any suitable mechanism for engaging each other, including for example one or more mechanical snaps or other coupling mechanisms.

To ensure that the connectors remain in contact upon assembly, flexes 310 and 320 can be coupled to each other around connectors 312 and 322. For example, adhesive 330 and 332 (e.g., a pressure sensitive adhesive) can be placed on opposite sides of connectors 312 and 322 to connect flexes 310 and 320. Flexes 310 and 320 can be connected such that there is insufficient play between the flexes for connectors 312 and 322 to disengage.

Figure 4:
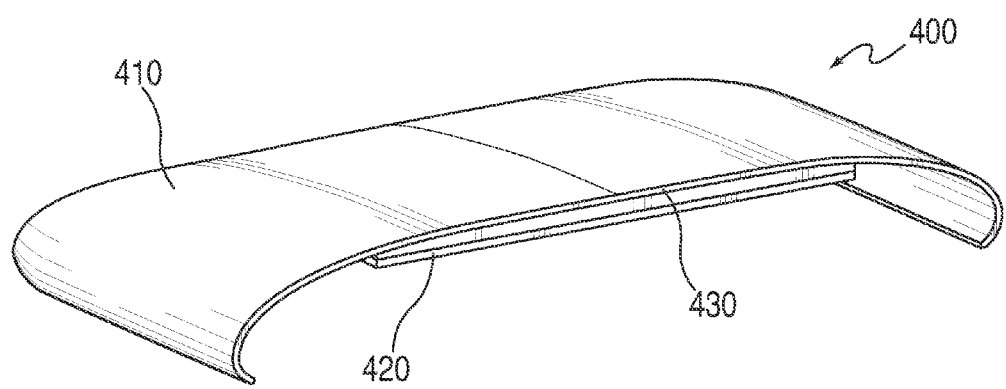
FIG. 4 is a schematic view of an illustrative device housing and seal in accordance with one embodiment of the invention.

In some cases, an electronic device can include a component that needs to be acoustically sealed, mechanically sealed, or both relative to other components of the device. For example, an electronic device can include a speaker (e.g., a piezoelectric speaker) that is coupled to the device housing in a manner that prevents sound from leaking from the speaker within the device. FIG. 4 is a schematic view of an illustrative device housing and seal in accordance with one embodiment of the invention. Device 400 can include housing 410, which can be manufactured from any suitable material. In some embodiments, housing 410 can include a curved or arbitrary shape to provide an aesthetically or cosmetically pleasing device exterior. Because housing 410 may have an unusual or complex shape, it may be difficult to manufacture a seal from a single material that simultaneously matches the shape of housing 410 while providing a resistant seal when subject to pressure or forces exerted by the user or by other components of the device. In particular, harder materials may be easier to form in the shape of housing 410, but may have limited travel or play when forces are applied to the materials. Alternatively, foams or softer materials may more easily deform in response to external forces, but may be difficult to manufacture in a manner to match the shape of housing 410.

To ensure that the seal both matches the shape of housing 410 and deflects sufficiently to absorb forces applied to the seal, the seal can be constructed from both a harder material manufactured to match the shape of housing 410 and a foam to deflect in response to external forces. For example, the seal can include foam element 420 and shaped element 430, such that shaped element 430 is placed in contact with housing 410 and foam element 420 is placed against the opposite side of shaped element 430 (e.g., shaped element 430 is between housing 410 and foam element 420). Shaped element 430 can be manufactured to match the shape of housing 410 from any suitable material, including for example from silicon, plastic, rubber, or any other suitable material.

Figure 5:
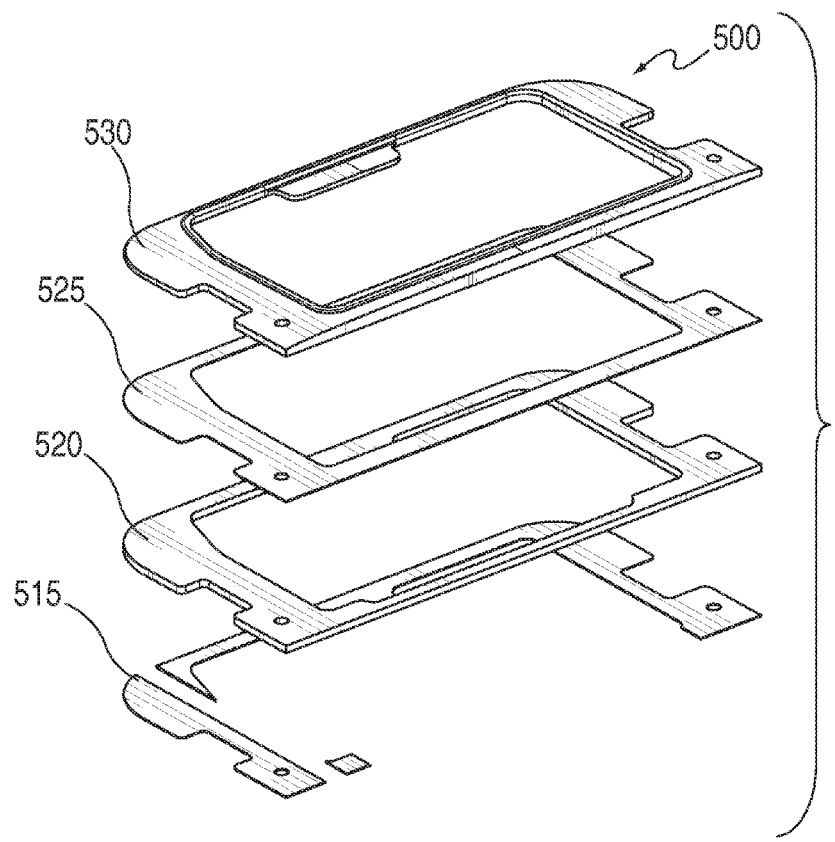
FIG. 5 is an exploded view of an illustrative seal for use in an electronic device in accordance with one embodiment of the invention.

FIG. 5 is an exploded view of an illustrative seal for use in an electronic device in accordance with one embodiment of the invention. Seal 500 can include foam element 520 and shaped element 530, which can include some or all of the features of the corresponding elements of FIG. 4. Foam element 520 can be coupled to shaped element 530 using any suitable approach, including for example using adhesive layer 525 (e.g., a pressure sensitive adhesive). Seal 500 can be coupled to an electronic device component (e.g., a speaker) using any suitable approach, including for example using a mechanical connector or an adhesive. In the example of FIG. 5, seal 500 can be coupled to a device component using adhesive layer 515. Similarly, seal 500 can be coupled to the housing using any suitable approach, including for example using a mechanical connector or an adhesive. In some embodiments, however, seal 500 and its attached device component can be retained against the housing from the pressure of other components or device elements pressing seal 500 against the housing.

Figure 6:
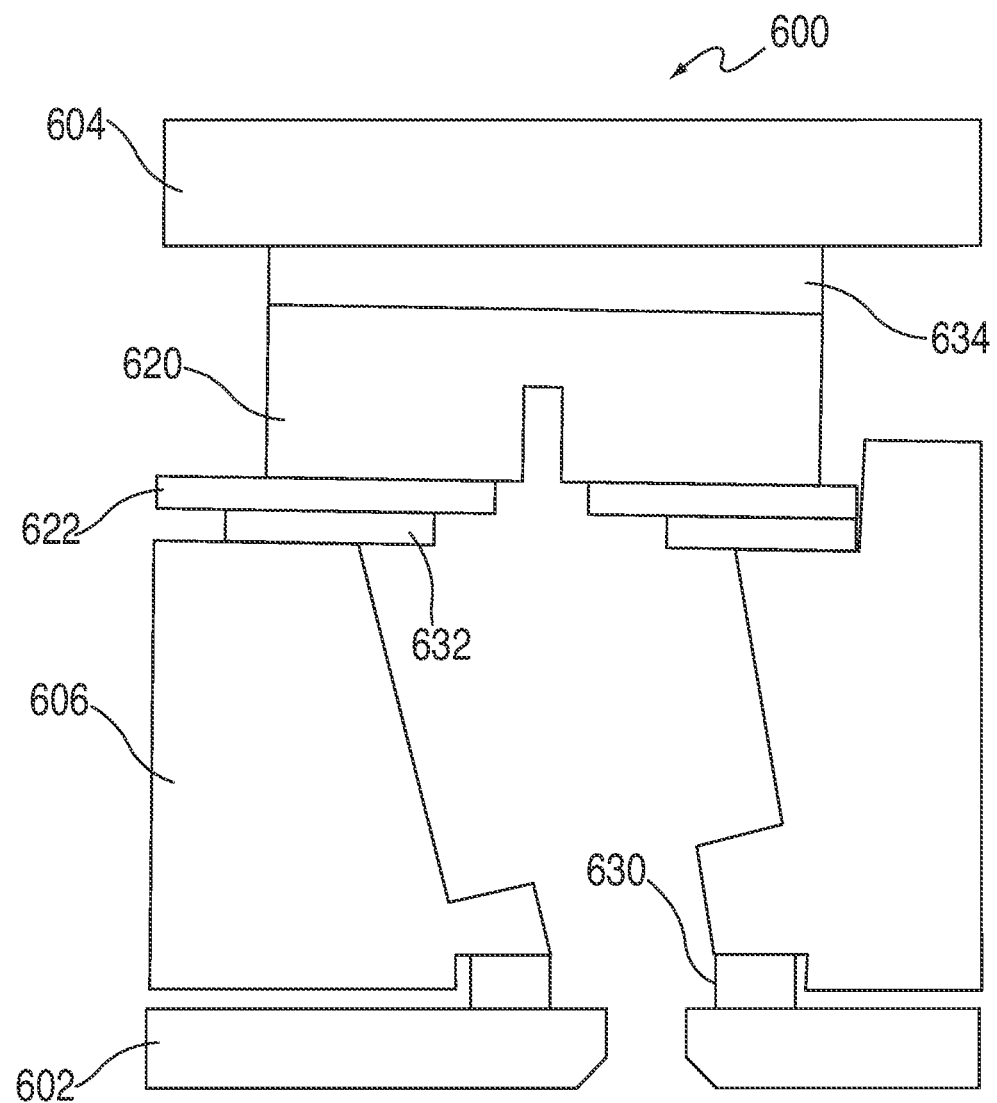
FIG. 6 is a cross-sectional view of an illustrative assembly for acoustically and mechanically isolating a microphone in accordance with one embodiment of the invention.

Other electronic device components may instead or in addition require acoustic and mechanical isolation from the other device components. For example, a microphone may need to be acoustically isolated so that only sounds from outside the electronic device are detected, as well as mechanically isolated to prevent vibrations or other noise generated by device components from interfering with the microphone operation. When the microphone is mounted directly to a circuit board, this may be especially necessary. FIG. 6 is a cross-sectional view of an illustrative assembly for acoustically and mechanically isolating a microphone in accordance with one embodiment of the invention. Device 600 can include microphone 620 mounted to circuit board 622 and placed between housing 602 and glass 604. Microphone 620 can be offset from housing 602 by mount 606, which can include a chamber for directing external sound to microphone 620. Mount 606 can be constructed from any suitable material, including for example from plastic.

To isolate microphone 620 from other components of electronic device 600, first foam layer 630 can be placed between housing 602 and mount 606. First foam layer 630 may be particularly effective for preventing audio from leaking from the chamber defined by mount 606 to other components of the device, and to prevent sound from other components from leaking into mount 606. To limit the noise transferred between mount 606 and circuit board 622, second foam layer 632 can be placed between circuit board 622 and mount 606. To prevent noise caused by tapping on glass 604 to propagate to microphone 620, third foam layer 634 can be placed between glass 604 and microphone 620.

Each layer of foam can be coupled to its adjacent components of electronic device 600 using any suitable approach. In some embodiments, an adhesive may be used. Alternatively, all of the components can be mounted between housing 602 and glass 604 such that a press fit occurs and the components press against each other to retain their respective positions within the electronic device. In some cases, a combination of these approaches or other approaches can be used to secure each layer of foam within electronic device 600.

Figure 7:
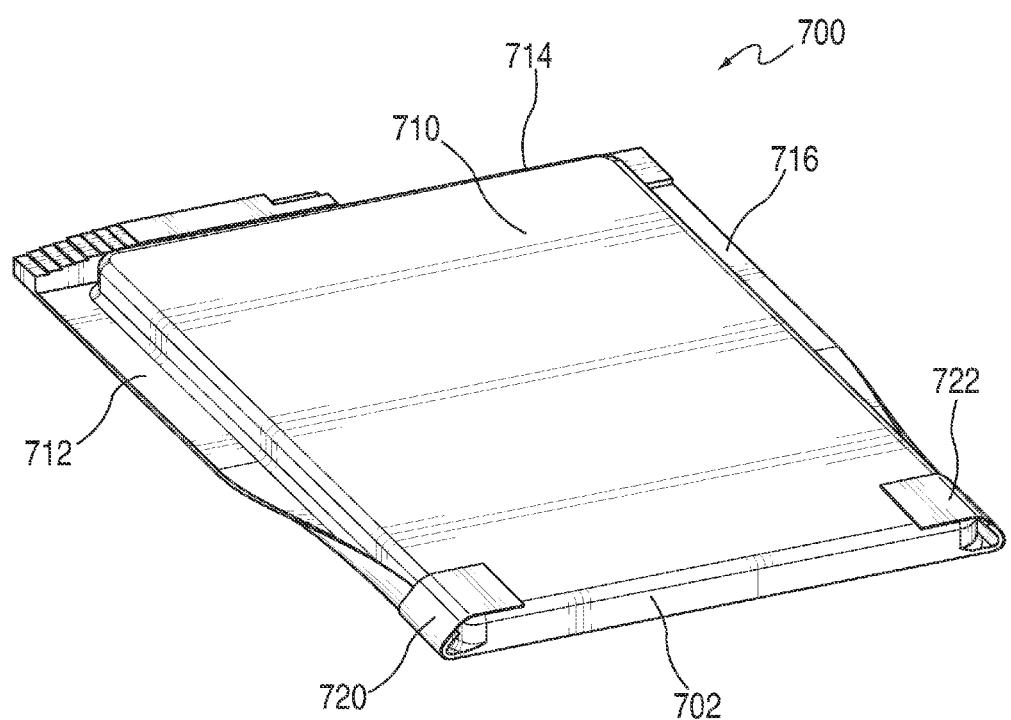
FIG. 7 is a schematic view of an illustrative battery used in an electronic device in accordance with one embodiment of the invention.

To power the electronic device, a battery can be placed within the device housing. The battery can be constructed using any suitable approach. In some embodiments, the battery can include a cell wrapped in a sheet of material. FIG. 7 is a schematic view of an illustrative battery used in an electronic device in accordance with one embodiment of the invention. Battery 700 can include cell 702 placed within sheet 710. Sheet 710 can be wrapped around cell 702 such that opposing surfaces of sheet 710 are sealed. The resulting battery 700 can include sealed flaps 712, 714 and 716 extending around three sides of cell 702.

Flaps 712, 714 and 716 can be left down flat or folded up towards cell 702 to ensure proper placement of battery 700 in the electronic device. The decision to fold or leave the flaps down can depend, for example, on the position of other components within the device and relative to the battery. In some cases, however, other components can be placed such that the flaps must simultaneously remain flat and be folded up. To do so, different portions of the flaps can be folded up and retained using tape (e.g., tape 720 and 722). In the example of battery 700, portions of flaps 712 and 716 can be folded up and retained by tape 720 and 722 (e.g., portions adjacent to an end of battery 700), while the remaining parts of flaps 712 and 716, as well as flap 714 can remain flat.

The previously described embodiments are presented for purposes of illustration and not of limitation. It is understood that one or more features of an embodiment can be combined with one or more features of another embodiment to provide systems and/or methods without deviating from the spirit and scope of the invention. The present invention is limited only by the claims which follow.

What is claimed is:

1. An acoustic seal for use with an electronic device housing having an arbitrary shape, the acoustic seal comprising:
    a first layer constructed from a material molded to fit the arbitrary shape of the device housing and including a first interior peripheral surface;
    a second layer including a second interior peripheral surface and coupled to the first layer, the second layer constructed from a foam material, wherein the first layer is positioned between the second layer and the housing; and
    an adhesive for coupling the first layer to the second layer wherein:
        the second layer is located between the first layer and an electronic component which is at least one of a speaker or a microphone; and
        the first layer interior peripheral surface, the second layer interior peripheral surface, the electronic component, and the device housing form an acoustic cavity that reduces sound from transitioning between the cavity and an interior of the electronic device; wherein
    the interior peripheral surface surrounds an aperture in the device housing;
    the aperture extends from the acoustic cavity, through the housing and to an environment exterior to the device; and
    the acoustic cavity directs sound through the hole in the device housing.

2. The acoustic seal of claim 1, wherein:
the first layer is constructed from a material that deflects substantially less than the foam material of the second layer.

3. The acoustic seal of claim 1, wherein: the second layer comprises a die cut foam layer.

4. The acoustic seal of claim 1, further comprising a second layer of adhesive for coupling an acoustic component to the seal, the second layer coupled to the second layer.

5. The acoustic seal of claim 1, wherein the first layer is constructed from silicon.

6. The acoustic seal of claim 1, wherein the second layer is constructed from Poron.

7. An electronic device, comprising: a housing having a curved surface;
    at least one electric component operationally sensitive to acoustic and mechanical vibrations;
    an acoustic seal assembly coupled to the curved surface and coupled to the at least one component, the acoustic seal assembly comprising:
        a conformable element having a first side, a second side, and an interior peripheral surface, the first side constructed to fit flush against the curved surface;
        a first adhesive layer attached to the second side of the conformable element; and
        a foam element having a first side, a second side, and an interior peripheral surface, the first side attached to the first adhesive layer and the second side attached to the electric component; wherein:
    the interior peripheral surface of the conformable element, the interior peripheral surface of the foam element, the at least one component, and the device housing form an acoustic cavity that limits sound from leaking from the electric component within the device; and
    the interior peripheral surface of the conformable element surrounds an aperture in the device housing;
    the aperture extends from the acoustic cavity, through the housing and to an environment exterior to the device; and
    the acoustic cavity directs sound through the aperture in the device housing.

8. The device of claim 7, wherein the acoustic seal further comprises a second adhesive layer attached to the second side of the foam layer.

9. The device of claim 7, wherein the acoustic seal further comprises a mechanical connector attached to the second side of the foam layer.

10. The device of claim 7, wherein the at least one electric component is a piezoelectric speaker.

11. The device of claim 7, wherein the conformable element is constructed from a material having a greater density than the foam element.

* * * * *